US006294437B1

(12) United States Patent
Lin

(10) Patent No.: US 6,294,437 B1
(45) Date of Patent: Sep. 25, 2001

(54) METHOD OF MANUFACTURING CROWN-SHAPED DRAM CAPACITOR

(75) Inventor: Dahcheng Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/440,902

(22) Filed: Nov. 16, 1999

(30) Foreign Application Priority Data

Oct. 18, 1999 (TW) .................................. 88117960

(51) Int. Cl.⁷ ................... H01L 21/8242; H01L 21/20
(52) U.S. Cl. .................. 438/396; 438/239; 438/253; 438/254; 438/255; 438/393; 438/397
(58) Field of Search .................... 438/239, 240, 438/238, 250–256, 381, 390–399

(56) References Cited

U.S. PATENT DOCUMENTS 5,597,756 * 1/1997 Fazan et al. .......................... 438/398
6,054,347 * 4/2000 Lin ....................................... 438/253
6,096,653 * 8/2000 Tu et al. ............................... 438/697

* cited by examiner

Primary Examiner—John F. Niebling
Assistant Examiner—Ha Tran Nguyen
(74) Attorney, Agent, or Firm—Jiawei Huang; J. C. Patents

(57) ABSTRACT

A method of manufacturing a crown-shaped DRAM capacitor. A silicon oxide layer and a silicon nitride layer are sequentially formed over a substrate. A conductive plug passing through the silicon oxide layer and the silicon nitride layer is formed. A first and a second dielectric layer are sequentially formed over the silicon nitride layer and the conductive plug. A first opening that exposes the conductive plug and a portion of the silicon nitride layer surrounding the plug is formed in the second and the first dielectric layer. A doped amorphous silicon layer conformal to the substrate profile is formed. The doped amorphous silicon layer above the second dielectric layer is removed. The second dielectric layer is next removed, and then hemispherical silicon grains (HSGs) are grown over the exposed surface of the doped amorphous silicon layer. The first dielectric layer is removed, and finally a third dielectric layer and a conductive layer are sequentially formed over the substrate.

10 Claims, 2 Drawing Sheets

METHOD OF MANUFACTURING CROWN-SHAPED DRAM CAPACITOR

CROSS-REFERENCE TO RELATED APPLICATION

This application claims the priority benefit of Taiwan application serial no. 88117960, filed Oct. 18, 1999.

BACKGROUND OF THE INVENTION

1. Field of the Invention

The present invention relates to a method of manufacturing dynamic random access memory (DRAM). More particularly, the present invention relates to a method of manufacturing a crown-shaped DRAM capacitor.

2. Description of the Related Art

A capacitor is a principle component in each dynamic random access memory (DRAM) cell. The amount of electric charges stored in a capacitor can affect its susceptibility to external interference such as alpha particles and hence soft errors. In addition, refreshing frequency also depends on the storage capacity of a capacitor.

A charge storage problem is accentuated by newer generation of memories whose feature dimensions are reduced to below 0.25 µm. To increase the capacitance of a capacitor in a smaller area, effective surface of the capacitor must be increased. The formation of a crown-shaped structure is one of the methods to increase the surface area of a capacitor. To increase capacitance even further, especially for fabricating semiconductor devices having a feature dimension smaller than 0.18 µm, hemispherical silicon grains (HSGs) are also formed on the interior and exterior sidewalls of the crown-shaped structure.

In general, a capacitor with a crown-shaped structure is formed by forming a silicon oxide layer and a silicon nitride layer in sequence over a substrate. A polysilicon plug is next formed through the silicon oxide layer and the silicon nitride layer. A second silicon oxide layer is formed over the silicon nitride layer and the polysilicon plug, and then a crown-shaped opening is formed in the second silicon oxide layer. A doped amorphous silicon layer conformal to the sidewalls of the crown-shaped opening as well as the second silicon oxide layer is formed. Chemical-mechanical polishing (CMP) is next carried out to remove the doped amorphous silicon layer above the second silicon oxide layer so that the lower electrodes of different capacitors are isolated from each other. A portion of the second silicon oxide layer is removed so that an oxide layer with a definite thickness remains on top of the silicon nitride layer as a protective layer. The silicon nitride layer needs to be protected because hemispherical silicon grains (HSGs) may also form over the silicon nitride layer when HSGs are formed over the doped amorphous silicon layer. If a layer of HSGs is formed on the silicon nitride layer, the lower electrode of different capacitor may be short-circuited.

In the aforementioned method, the second silicon oxide layer must be etched twice in two separate etching operations. Since there is no reference etching point layer for determining the end of the operation, the first etching operation can only be arbitrarily controlled by etching duration. In general, the first etching of the second silicon oxide layer is conducted using diluted hydrofluoric acid (DHF) or hydrogen fluoride steam. If diluted hydrofluoric acid is used to carry out the etching, silicon wafers are normally inserted vertically into a bath of the liquid. Consequently, the portion of the wafer dipped into the bath the earliest will remain in the bath for the longest period. Moreover, different portions of the wafer will be immersed inside the bath for a different duration. Hence, the resulting thickness of the second silicon oxide layer on a wafer will vary from place to place, and the capacitance of each capacitor will be different, with serious consequences.

On the other hand, if hydrogen fluoride vapor steam is used to carry out the etching, some non-volatile residues may adhere to the surface of the wafer. These residues are difficult to remove and may lead to the formation of defects on the wafer.

SUMMARY OF THE INVENTION

The invention provides a method of manufacturing a crown-shaped DRAM capacitor. A silicon oxide layer and a silicon nitride layer are sequentially formed over a substrate. A conductive plug is formed, passing through the silicon oxide layer and the silicon nitride layer. A first and a second dielectric layer are sequentially formed over the silicon nitride layer and the conductive plug. A first opening that exposes the conductive plug and a portion of the silicon nitride layer surrounding the plug is formed through the second and the first dielectric layer. A doped amorphous silicon layer conformal to the substrate profile is formed. The doped amorphous silicon layer above the second dielectric layer is removed. The second dielectric layer is next removed, and then hemispherical silicon grains (HSGs) are grown over the exposed surface of the doped amorphous silicon layer. The first dielectric layer is removed. Finally, a third dielectric layer and a conductive layer are sequentially formed over the substrate.

The first dielectric layer can be a silicon oxide layer, and the second dielectric layer can be a borophosphosilicate glass layer, for example. The third dielectric layer can be, for example, a composite layer that includes a silicon nitride layer and a silicon oxide layer.

In this invention, the conventional second silicon oxide layer is replaced by the first and the second dielectric layer. Utilizing the difference in material properties between the first and the second dielectric layer, the first dielectric layer can function as an etching stop layer in the etching of the second dielectric layer. The first dielectric layer also serves as a protective layer for the silicon nitride layer, only to be removed after HSGs are grown over the exposed doped amorphous silicon layer.

In brief. the first dielectric layer not only functions as an etching stop layer for etching the second dielectric layer, but also prevents the growth of hemispherical silicon grains over the silicon nitride layer. Hence, capacitors with the same design will have identical capacitance and wafer yield will greatly increase.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
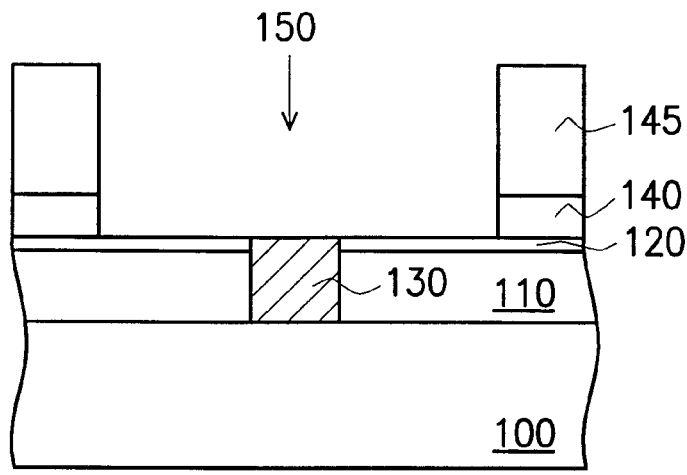
FIGS. 1A through 1E are schematic cross-sectional views showing the progression of steps for producing a crown-shaped DRAM capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing the progression of steps for producing a crown-shaped DRAM capacitor according to one preferred embodiment of this invention.

As shown in FIG. 1A, a silicon oxide layer 110 and a silicon nitride layer 120 are formed in sequence over a substrate 100. The silicon oxide layer and the silicon nitride layer 120 can be formed by, for example, chemical vapor deposition (CVD). A portion of the silicon oxide layer 110 and the silicon nitride layer 120 is etched to form an opening. Conductive material such as doped polysilicon is deposited into the opening to form a conductive plug 130. A first and a second dielectric layer 140 and 145 are formed in sequence over the silicon nitride layer 120 and the conductive plug 130. A portion of the first and the second dielectric layer 140 and 145 is removed to form an opening 150 that exposes the conductive plug 130 and a portion of the silicon nitride layer 120 around the plug.

The first dielectric layer 140 can be a silicon oxide layer formed, for example, by high-density plasma chemical vapor deposition (HDPCVD) or plasma enhanced chemical vapor deposition (PECVD). The first dielectric layer 140 preferably has a thickness of about 500 angstroms to about 2000 angstroms. On the other hand, the second dielectric layer 145 can be a borophosphosilicate glass layer formed, for example, by chemical vapor deposition. The second dielectric layer preferably has a thickness of about 6000 angstroms to about 20000 angstroms.

Figure 1B:
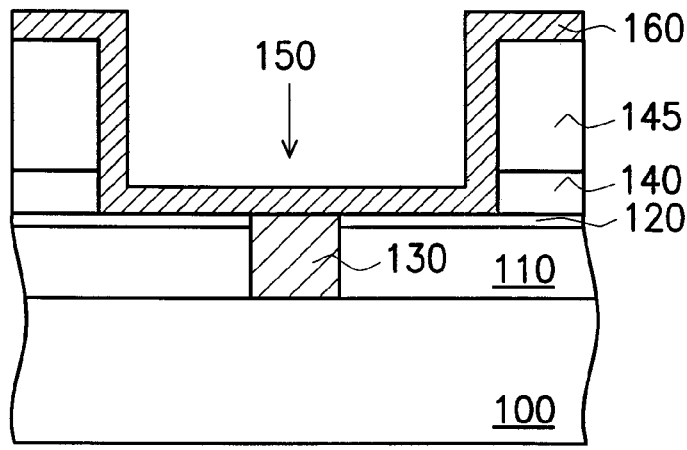

As shown in FIG. 1B, a doped amorphous silicon layer 160 conformal to the interior surface of the opening 150 and the second dielectric layer 145 is formed. The doped amorphous silicon layer 160 can be formed by, for example, performing low-pressure chemical vapor deposition at a temperature below 520° C. using silane ($SiH_4$) or di-silane ($Si_2H_6$) as a gaseous reactant.

Figure 1C:
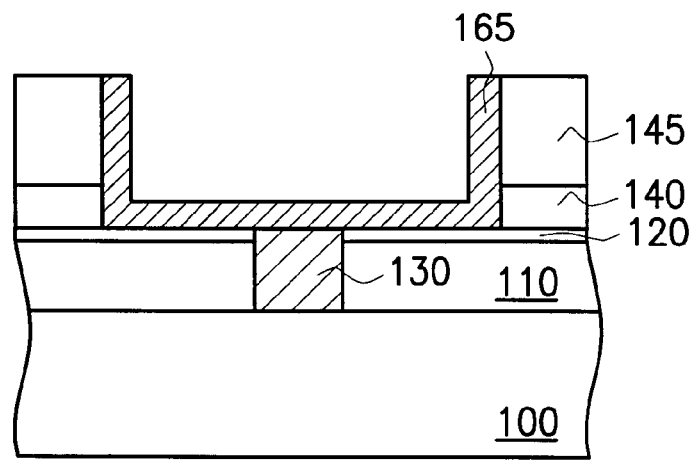

As shown in FIG. 1C, the doped amorphous silicon layer 160 above the second dielectric layer 145 is removed so that the lower electrodes 165 of different capacitors are isolated. The doped amorphous silicon layer 160 can be removed by, for example, chemical-mechanical polishing (CMP).

Figure 1D:
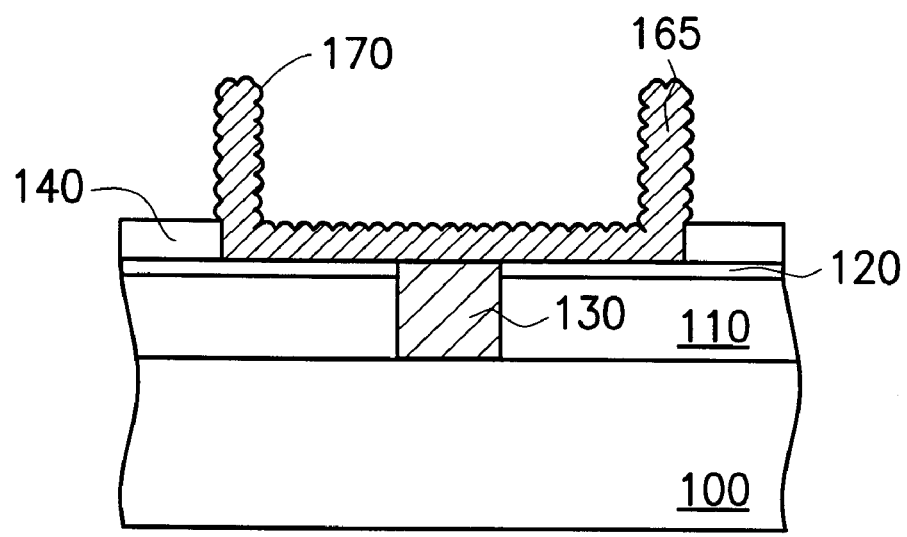

As shown in FIG. 1D, the second dielectric layer 145 is removed so that the interior and exterior surfaces of the lower electrode 165 are exposed. If the second dielectric layer 145 is a borophosphosilicate glass layer while the first dielectric layer 140 is a silicon oxide layer formed by HDPCVD or PECVD, the second dielectric layer 145 can be removed by etching using a hydrofluoric acid solution. The etching selectivity ratio is about 7 for borophosphosilicate glass/silicon oxide (by HDPCVD) and about 6 for borophosphosilicate glass/silicon oxide (by PECVD).

Seeding of the surface of the exposed doped amorphous silicon layer 160 is carried out at a temperature of between about 550° C. and 560° C. with silane ($SiH_4$ or $Si_2H_6$) flowing at a very slow rate (<<49 sccm). A high-vacuum annealing operation is next carried out at a temperature between about 550° C. and 590° C. so that hemispherical silicon grains (HSGs) 170 are grown on the exposed surface of the doped amorphous silicon layer.

Figure 1E:
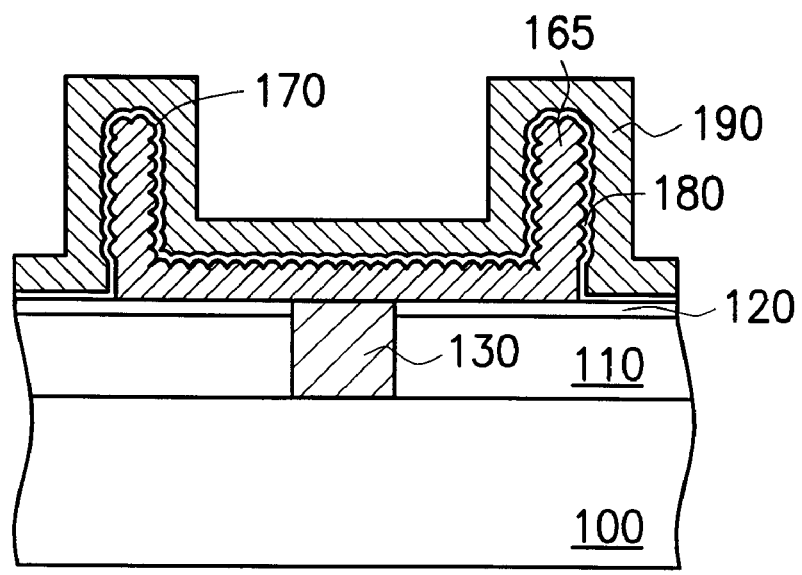

As shown in FIG. 1E. the first dielectric layer 140 is removed. A third dielectric layer 180 conformal to the substrate profile is formed over the lower electrode 165. A conductive layer 190 is formed over the third dielectric layer 180 to form a complete capacitor.

If the first dielectric layer 140 is a silicon oxide layer, the removal of the native oxide layer and the removal of the first dielectric layer 140 from the surface of the lower electrode 165 can be combined together. The native oxide on the lower electrode 165 can also be removed by a hydrofluoric acid solution. The third dielectric layer 180 can be, for example, a composite layer that includes a silicon nitride layer and a silicon oxide layer. The conductive layer 190 can be a doped polysilicon layer formed, for example, by chemical vapor deposition.

In this invention, the conventional second silicon oxide layer is replaced by the first dielectric layer 140 and the second dielectric layer 145. Utilizing the difference in material properties between the first and the second dielectric layer, the first dielectric layer can function as an etching stop layer in the etching of the second dielectric layer. Consequently, a uniformly thick layer is etched. Furthermore, the first dielectric layer 140 over the silicon nitride layer 120 prevents the growth of HSGs over the first dielectric layer 140 so that any short-circuiting between neighboring lower electrodes is prevented. In brief, the method of this invention can be applied to the fabrication of DRAM capacitor such that all capacitors with the same design will have identical capacitance anywhere on a silicon wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a crown-shaped dynamic random access memory (DRAM) capacitor, comprising the steps of:

providing a substrate having a first silicon oxide layer thereon;

forming a silicon nitride layer over the first silicon oxide layer;

forming a conductive plug that passes through the silicon nitride layer and the first silicon oxide layer;

forming a second silicon oxide layer over the silicon nitride layer and the conductive plug;

forming a borophosphosilicate glass layer over the second silicon oxide layer;

patterning the borophosphosilicate glass layer and the second silicon oxide layer to form an opening that exposes the conductive plug and a portion of the silicon nitride layer surrounding the plug;

forming a doped amorphous silicon layer conformal to interior sidewalls of the opening and exposed borophosphosilicate glass layer;

removing the doped amorphous silicon layer above the borophosphosilicate glass layer;

using an agent to remove the borophosphosilicate glass layer, wherein the agent remove the borophosphosilicate glass layer faster than the second silicon oxide layer;

growing hemispherical silicon grains on a surface of an exposed doped amorphous silicon layer, wherein the hemispherical silicon grains grow under a temperature of between about 550° C. and 560° C. with silane flowing at a rate less than 49 sccm; and removing the second silicon oxide layer.

2. The method of claim 1, wherein the step of forming the second silicon oxide layer includes high-density plasma chemical vapor deposition.

3. The method of claim 1, wherein the step of forming the second silicon oxide layer includes plasma-enhanced chemical vapor deposition.

4. The method of claim 1, wherein the second silicon oxide layer has a thickness of about 500 angstroms to about 2000 angstroms.

5. The method of claim 1, wherein the borophosphosilicate glass layer has a thickness of about 6000 angstroms to about 20000 angstroms.

6. A method of manufacturing a crown-shaped dynamic random access memory (DRAM) capacitor, comprising the steps of:

providing a substrate having a silicon oxide layer thereon;

forming a silicon nitride layer over the silicon oxide layer;

forming a conductive plug that passes through the silicon nitride layer and the silicon oxide layer;

forming a first dielectric layer over the silicon nitride layer and the conductive plug;

forming a second dielectric layer over the first dielectric layer;

forming an opening through the second and the first dielectric layer to expose the conductive plug and a portion of the silicon nitride layer surrounding the plug;

forming a doped amorphous silicon layer conformal to a substrate profile;

removing the doped amorphous silicon layer above the second dielectric layer;

using an agent to remove the second dielectric layer; wherein the agent can remove the second dielectric layer faster than the first dielectric layer;

growing hemispherical silicon grains on a surface of an exposed doped amorphous silicon layer, wherein the hemispherical silicon grains grow under a temperature of between about 550 ° C. and 560° C. with silane flowing at a rate less than 49 sccm;

removing the first dielectric layer;

forming a third dielectric layer over the exposed doped amorphous silicon layer and the silicon nitride layer; and forming a conductive layer over the third dielectric layer.

7. The method of claim 6, wherein the step of forming the first dielectric layer includes depositing silicon oxide by high-density plasma chemical vapor deposition when the second dielectric layer is a borophosphosilicate glass layer.

8. The method of claim 6, wherein the step of forming the first dielectric layer includes depositing silicon oxide in plasma-enhanced chemical vapor deposition when the second dielectric layer is a borophosphosilicate glass layer.

9. The method of claim 6, wherein hemispherical silicon grains grows faster on the surface of the doped amorphous silicon layer than on the surface of the first dielectric layer.

10. The method of claim 6, wherein the step of forming the third dielectric layer includes depositing silicon nitride and then silicon oxide to form a nitride/oxide composite layer.

* * * * *